(12) United States Patent
Schnabel et al.

(10) Patent No.: US 6,683,794 B2
(45) Date of Patent: Jan. 27, 2004

(54) ELECTRONICS ASSEMBLY

(75) Inventors: John David Schnabel, Fareham (GB); Andrew John Yair, Swindon (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,515

(22) Filed: Jun. 10, 2002

(65) Prior Publication Data

US 2003/0227758 A1 Dec. 11, 2003

(51) Int. Cl.⁷ .............................. H05K 7/14; H05K 7/18
(52) U.S. Cl. ..................... 361/797; 361/801; 361/759; 361/740; 361/798
(58) Field of Search .................. 361/797, 801, 361/798, 809, 829, 725, 724, 759, 740, 732, 726, 825, 683, 685, 752

(56) References Cited

U.S. PATENT DOCUMENTS

| | | | |
|---|---|---|---|
| 4,914,552 A | 4/1990 | Keemer | |
| 5,145,243 A | * 9/1992 | Liu | 312/265.1 |
| 5,394,305 A | 2/1995 | Moral et al. | |
| 5,734,561 A | 3/1998 | Wolf et al. | |
| 5,973,926 A | * 10/1999 | Sacherman et al. | 361/759 |
| 6,510,055 B1 | * 1/2003 | Liu et al. | 361/724 |

* cited by examiner

Primary Examiner—David Martin
Assistant Examiner—Hung Bui
(74) Attorney, Agent, or Firm—Meyertons Hood Kivlin Kowert & Goetzel, P.C.; B. Noël Kivlin (57) ABSTRACT

An electronics assembly may include a frame (1) and a motherboard module (18) have cooperating temporary supporting elements (50, 54, 60, 62) that can be engaged to support one edge of the motherboard module until some of the securing elements have been engaged to secure the motherboard module to the frame or after the securing elements have been released. The provision of temporary supporting elements enables a service engineer to support the motherboard module with a single hand while securing it in position with the other hand.

12 Claims, 5 Drawing Sheets

ELECTRONICS ASSEMBLY

BACKGROUND OF THE INVENTION

The present invention relates to electronics assemblies, and is primarily concerned with racked assemblies. Many such assemblies will be located in racks for housing in for example nineteen inch cabinets, or other size cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting frame or chassis that houses a motherboard or backplane and a number of daughterboards or module cards that extend in planes generally perpendicular to the plane of the motherboard and which are connected to the motherboard by connectors, e.g. high density connectors, so that the daughterboards can simply be located on guides and pushed toward the motherboard in order to connect them to it. Often only a single assembly will be located in a cabinet, but in many cases more than one, for example two, such assemblies will be housed in the cabinet, one above the other.

In addition, the motherboard may need to be removed for general maintenance purposes, upgrading or the like and so the frame of the assembly will normally provide for removal of the motherboard therefrom and re-insertion therein.

However, the motherboard can be relatively heavy, weighing in the region of 10 kg, and some form of support may be needed for the module as it is being removed from, and re-installed in, the frame.

SUMMARY OF THE INVENTION

According to one aspect, the invention provides an electronics assembly which comprises
(i) a frame; and
(ii) a generally planar, horizontal motherboard module that is removable by lowering the module from the bottom of the frame and which can be replaced by raising the module up to engage the bottom of the frame and securing it in position on the frame by means of one or more securing elements,
wherein the frame and the motherboard module have co-operating temporary supporting elements that can be engaged to support one edge of the motherboard module until the or at least some of the securing elements have been engaged to secure the motherboard module to the frame or after the securing elements have been released.

According to another aspect, the invention provides a frame for an electronics assembly to which a generally planar motherboard module can be attached by raising the motherboard module up from below the frame, the frame including at least one temporary supporting element, arranged on side therefore, that can co-operate with the motherboard module to support the module along one edge thereof.

According to a further aspect, the invention provides a motherboard module for attachment to the frame of an electronics assembly to provide a motherboard therefore, the module having one or more temporary supporting elements on one edge thereof that can engage the frame to support that edge of the module on the frame.

The assembly according to the invention may be one in which the motherboard is arranged in a generally horizontal plane and is located beneath the daughterboards, the daughterboards being slid along vertical card guides into and out of engagement with connectors located on the motherboard. In this case, the motherboard needs to be located accurately with respect to the card guides for the daughterboards and therefore with the frame of the assembly in which the daughterboards are housed. One simple method of accurately locating the motherboard with respect to the frame is to house the motherboards in a module having a generally planar support for the motherboard, and to offer up the motherboard module to the frame before securing the module to the frame by means of securing elements such as screws. The motherboard module and the frame may be, provided if desired, with guidance and location elements such as pins that are engaged in corresponding holes in order to ensure exact positioning of the motherboard with respect to the frame in a horizontal plane. Such an arrangement is relatively simple and provides mode accurate location of the motherboard in the frame than systems in which the motherboard can be slid into the frame in its own plane since such systems necessarily require lower tolerances for fitting the motherboard to the frame.

Once the motherboard module can be supported at one edge, it becomes relatively easy for a service engineer to support the motherboard module with one hand while securing it to the frame with the other.

The temporary supporting elements on the frame and on the motherboard module may together form a hinge that will support one edge portion of the motherboard module and will allow the opposite edge therefore to be raised and lowered by the service engineer as required before securing the motherboard module or after it has been unsecured from the frame. It is possible, if desired, to arrange the temporary supporting elements, or arrange other parts of the assembly, to allow the opposite edge portion of the motherboard module to be lowered only by a predetermined amount, or alternatively it can be allowed to be lowered until it rests on the floor or on any lower equipment in the cabinet.

In one form of assembly according to the invention the temporary supporting element on the frame or on the motherboard module can simply be in the form of a flange that can engage a corresponding flange, hooks or other structure on the other of the frame on the motherboard module.

Alternatively, the temporary supporting element on one of the frame and the motherboard module can be in the form of one or more pins, hooks or other elements that can engage one or more holes in the other of the frame and the module so that the point at which the pins engage the holes acts as a hinge point for pivoting of the motherboard module. Usually the pins will be located on the motherboard module and will engage holes in the rear of the frame.

It is possible for the holes that receive the pins to be circular, but this does not allow movement of the motherboard module in the vertical direction if required when engaging the securing elements. Accordingly, the holes in the frame, or in the motherboard module, if the pins are located on the frame, are elongate in the vertical direction. This allows some relative vertical movement between the frame and the motherboard module, and allows, for example, the motherboard module to be lifted off the temporary supporting element on the frame when the, or at least some of the, securing elements are engaged.

The relative vertical movement of the motherboard module and the frame may be useful to compress an electromagnetic interference (EMI) gasket when engaging the securing element(s). For example if, as will usually be the case, screws are employed as the securing elements, some vertical movement of the motherboard module will be likely when tightening the screws.

Guidance elements may be included on the frame and/or on the motherboard module for locating the motherboard module with respect to the frame in a horizontal plane rather than simply relying on the securing elements to perform the positioning.

Support may be provided to one or more edges/corners of the motherboard module. For example, attachment elements could be provided on the edge of the the motherboard module and/or of the frame located opposite that edge on which the temporary supporting elements are located so that the motherboard module can be supported below the frame in a horizontal plane without the need for the service engineer to use any hands at all to support the motherboard module while engaging the securing elements.

According to yet another aspect, the invention provides a method of attaching a motherboard module to the frame of an electronics assembly, which comprises (i) raising up the motherboard module from below the frame and attaching one edge of the motherboard module to a lower edge of the frame by means of co-operating temporary supporting elements located on the motherboard module and on the frame;

(ii) lifting the opposite edge of the motherboard module toward the frame to locate the motherboard module in a generally horizontal plane at the bottom of the frame; and (iii) securing the motherboard module to the frame by means of one or more securing elements while manually supporting the said opposite edge of the motherboard module.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
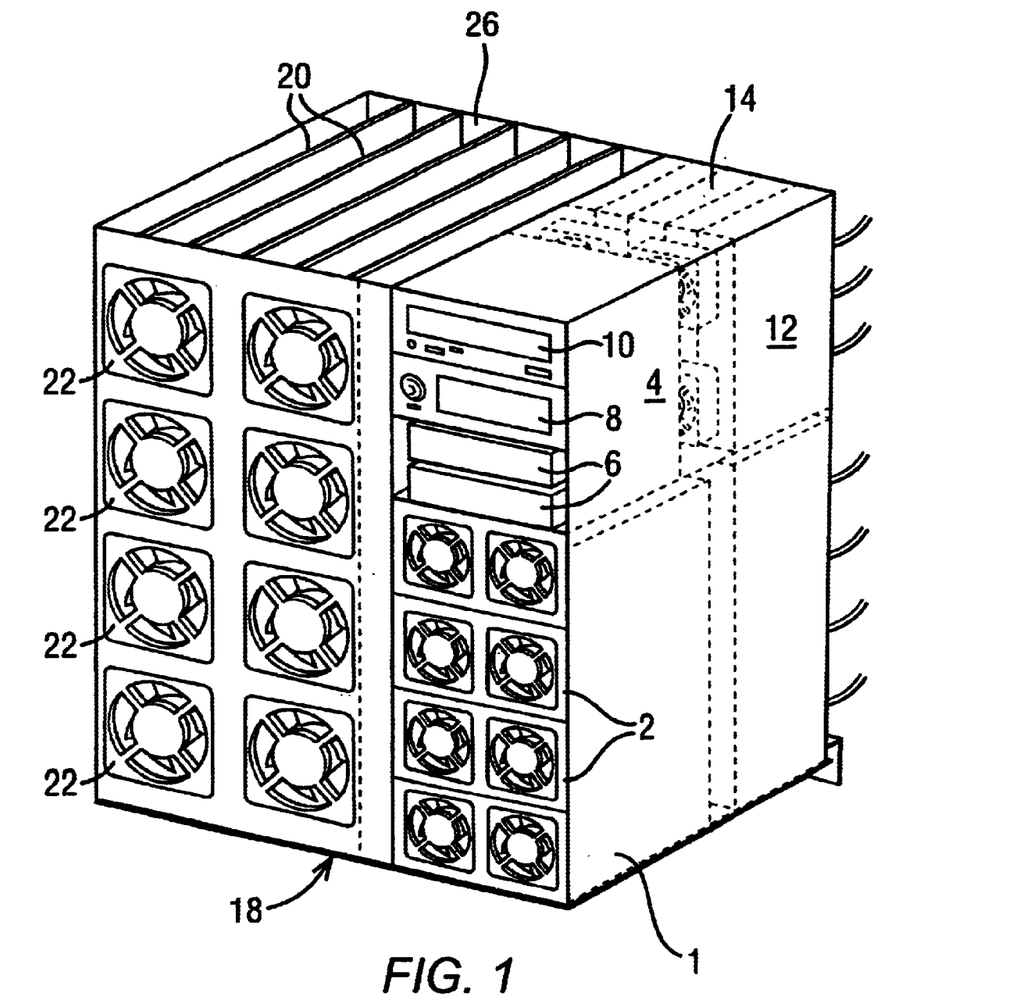
FIG. 1 is a schematic isometric view of an assembly according to an embodiment of the present invention.

Referring now to the drawings, in which like reference numerals are used to designate corresponding elements, FIG. 1 shows an assembly according to one embodiment of the invention that forms part of a server that may be employed for a number of services, for example as part of a local area network (LAN) and is designed as a nineteen inch or twenty three inch rack to be located in an electronics cabinet.

The assembly comprises a frame 1 in which the various components are located. The frame 1 contains a number of power modules 2 for converting mains a.c. power to an appropriate d.c. voltage, a part 4 that contains hard disk drives 6, a tape drive 8 and a CD-ROM or digital video disc drive 10, and a part 12 that contains a number of I/O cards 14. A motherboard 16 is located within the frame in a horizontal plane at the bottom of the frame in a tray-shaped holder which, together with the motherboard, forms a motherboard module 18, and a number of daughterboards 20 are arranged next to each other in a vertical plane above the motherboard 16 and to the side of the power modules 2. The daughterboards may serve any of a number of purposes, for example having CPUs or may be repeater boards etc. Finally, a number of fans 22 are provided in an array at the front of the frame in order to blow air through the assembly between the daughterboards 20 for cooling.

Any of the electronics components of the assembly may need to be removed and replaced from time to time, for example for repair or for upgrading, and in order to do this the daughterboards 20 can simply be lifted out of the frame through the opening at the tope of the assembly. If the motherboard 16 needs attention, the daughterboards must first be removed, and then the motherboard module 18 may be removed by unscrewing a number of captive screws 40 that are located in screw holes 42 extending around the periphery of the module 18 and the lower edge of the frame 1 and lowering the module down from the frame. A new motherboard module 18 may then be offered up to the frame 1 and secured in place, the daughterboards 20 re-inserted into frame along the card guides 24 into engagement with the motherboard via connectors 30 on the motherboard 16 and corresponding connectors (not shown) on the daughterboards.

Figure 2:
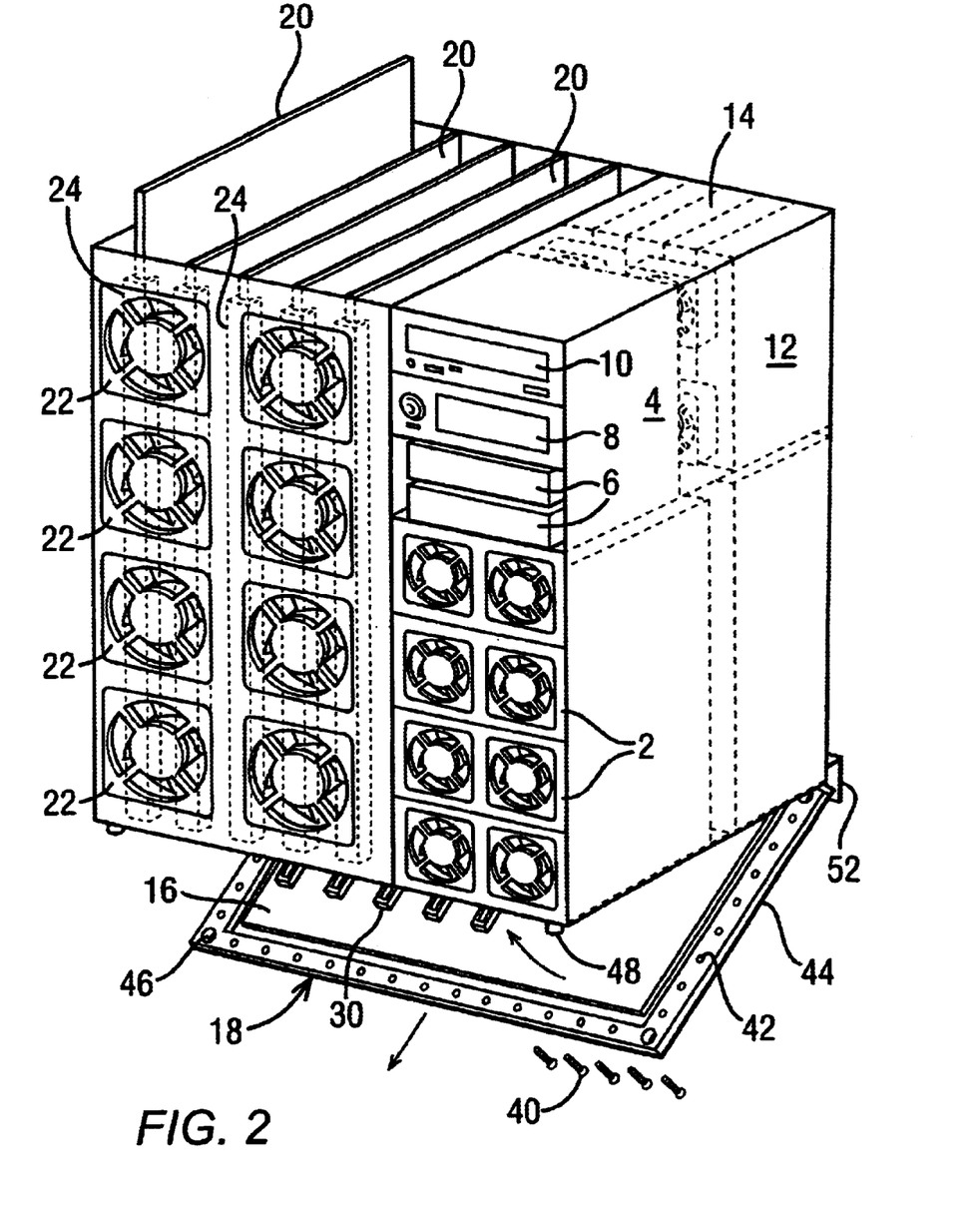
FIG. 2 is a schematic view corresponding to FIG. 1 but with a daughterboard and the motherboard partly removed.

In order to support the motherboard module 18 during unscrewing of the captive screws 40, it is attached to the rear side of the frame 1 so that, after removal of all the screws, the front end of the module can be lowered down to the floor as shown in FIG. 2 before it is separated from the frame.

If the assembly is rack mounted at the bottom of a cabinet, there may be relatively little room between the bottom of the assembly and the floor.

Figure 3:
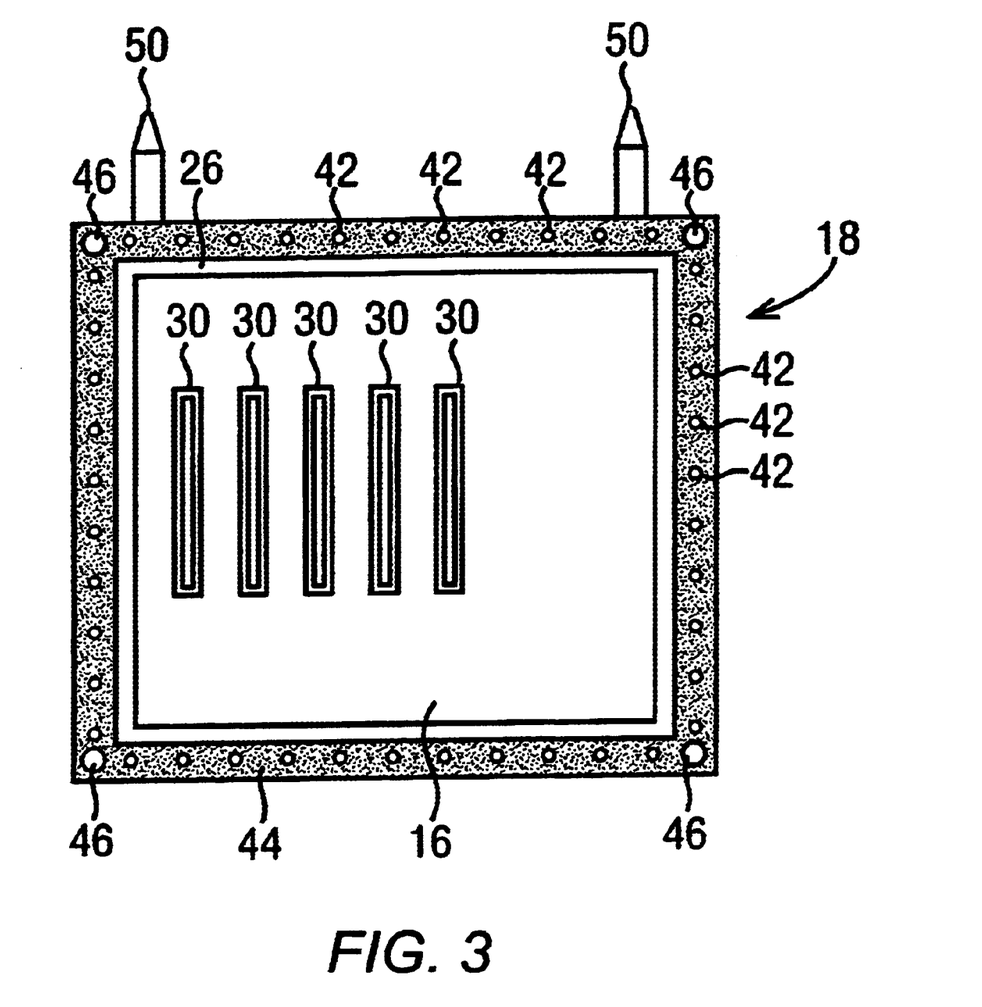
FIG. 3 is a top plan view of a motherboard module of an embodiment of the present invention.
Figure 4:
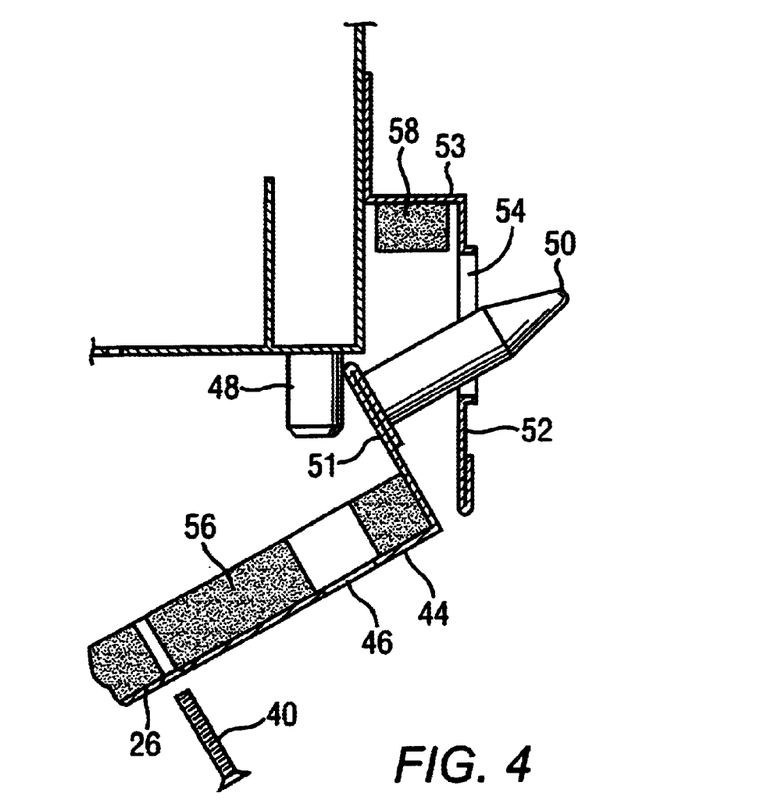
FIG. 4 is a side view of the part of the assembly according to an embodiment of the invention with the motherboard module lowered.

FIG. 3 shows one form of motherboard module 18 according to the invention and FIG. 4 shows part of the rear of the module together with part of the rear of the frame 1 of the assembly. The motherboard module 18 comprises the motherboard 16 together with a motherboard holder 26 having a peripheral region 44 containing an array of screw holes 42 to enable it to be secured in place against the bottom of the frame. The holder 26 has a hole 46 in each corner to receive a location pin 48 located on the frame in order to ensure correct positioning of the motherboard with the frame and, in particular, correct positioning of connectors 30 on the motherboard with corresponding connectors on the daughterboards.

The motherboard module has two temporary supporting pins 50 located on a flange 51 at the rear of the holder 26, and the frame 1 has an extension on its rear lower edge in the form of a web 52 or shirt may extend along the width of the assembly and is attached by welding, riveting, or other appropriate method such that the lower part thereof extends a few centimetres below the rest of the frame and is spaced from the rear outward surface of the frame by one or two centimetres by means of a horizontal part 53 thereof. The web 52 may be formed from the same material as that of the frame or a similar material to it, for example steel or zinc plated or aluminum zinc plated steel. The web has two holes 54 therein for receiving the temporary supporting pins 50 of the motherboard module, the holes being elongate in the vertical direction so that they will allow a degree of vertical movement of the motherboard module while only allowing a very limited amount of lateral movement thereof. The motherboard holder has an electromagnetic interference (EMI) gasket 56 extending along at least part of the peripheral region 44 thereof, and the web 52 is provided on the under surface of the horizontal part 53 thereof with a further EMI gasket 58.

Figure 5:
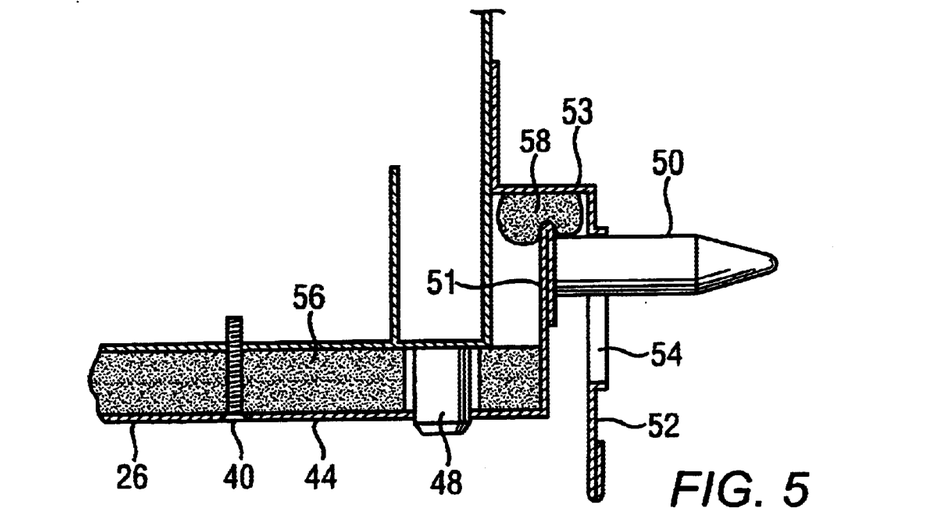
FIG. 5 is a side view of part of the assembly of FIG. 4 with the motherboard secured to the frame.

In order to attach the motherboard module 18 to the base of the frame, it is first located under the frame and the pins 50 are inserted into the holes 54 in the web 52 behind the rear of the frame 1 as shown in FIG. 4. The rear end of the motherboard module can then be supported by engagement of the pins 50 in the holes 54, and the front end of the module can then be lifted with one hand to a horizontal position leaving one of the service engineer's hands free to secure the module to the lower side of the frame 1 by means of the captive screws 40. As the screws 40 are tightened in the screw holes (not shown) in the lower surface of the frame 1, the motherboard holder 26 rises up and the location pins 48 are engaged into the holes 46 in the corners of the holder. FIG. 5 shows part of the assembly when the screws 40 have been lightened and the motherboard holder is secured in place. The ability of the hole 54 to allow some lateral movement of the pins 50 therein allows the location pins 48 and holes 46 to ensure correct positioning of the motherboard module with respect to the frame. In addition, the EMI gasket 56 extending along the peripheral edge region of the motherboard is compressed by the lower surface of the frame, and the gasket 58 extending along the horizontal part 53 of the web 52 attached to the rear of the frame is compressed against the top edge of the flange 51 at the rear of the motherboard holder 26, so that a good seal against EMI is obtained.

In a modification of this form of assembly, the pins 50 may be located on the web 52 on the rear of the frame and the corresponding holes 54 may be located on the flange 51 at the rear of the motherboard holder 26. The pins may, in this case be oriented toward the front of the frame or, if they are directed rearwardly, the flange 51 is positioned behind the web 52.

Figure 6:
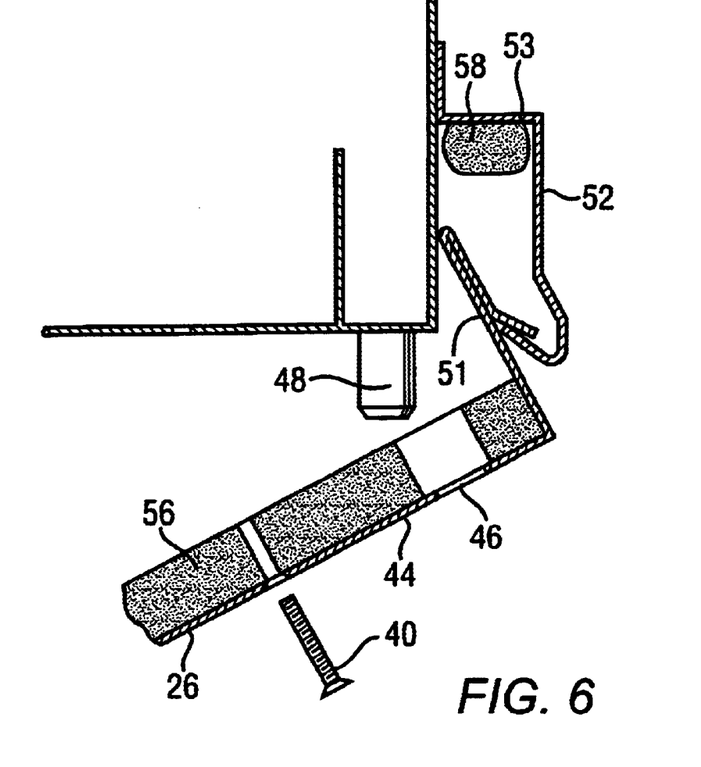
FIG. 6 is a side view of a part of an alternative form of assembly with the motherboard module lowered.
Figure 7:
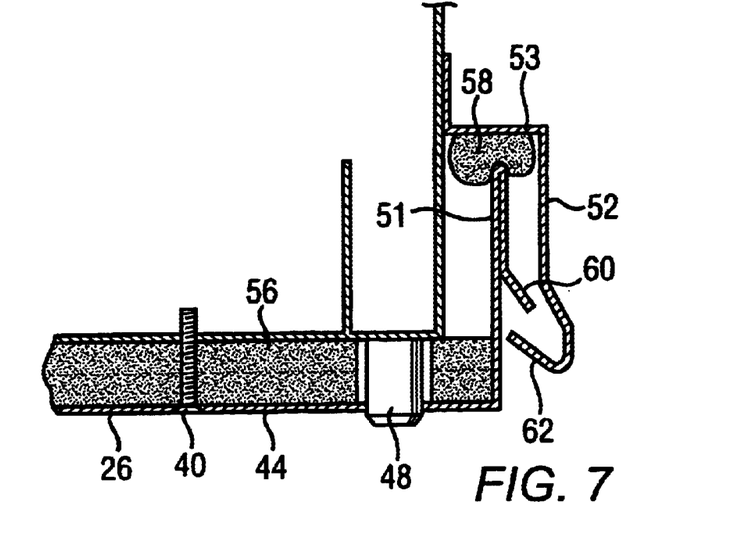
FIG. 7 is a side view of part of the assembly of FIG. 6 with the motherboard module secured to the frame.

An alternative form of assembly is shown in FIGS. 6 and 7. In this form of assembly, the motherboard holder 26 is provided at its rear peripheral edge with a flange 51 that is folded back on itself and has an outwardly (i.e. rearwardly) projecting lip 60 along its length. The web 52 that is attached to the rear wall of the frame 1 is also folded at is lower end to form a corresponding lip 62 that is directed toward to the front of the frame.

In order to attach the motherboard module 18 to the frame, the module is placed below the frame as before and the rear end thereof is lifted in order in order to hook the lip 60 over the inwardly directed lip 62 on the web 52 as shown in FIG. 6. The service engineer can then simply lift the front end of the motherboard holder 26 and support it generally in position with one hand while screwing the screws 40 home to secure the motherboard holder to the bottom of the frame 1 as shown in FIG. 7. With this modification, as before, tightening the screws 40 will cause the holder 26 to rise and cause the gaskets 56 and 58 to be compressed against the lower surfaces of the frame 1 and the horizontal part 53 of the web 52 respectively.

In this modification, the lips 60 and 62 forming the temporary supporting elements move out of engagement as the screws are tightened and the motherboard holder 26 rises, which enables the motherboard holder to move in the horizontal directions to allow correct location thereof with respect to the frame 1 by means of the location pins 48 on the frame.

The width of the lips 60 and 62 (that is, in a direction toward the front or the rear of the assembly) should be such that the lips overlap one another when the motherboard holder 26 is secured to the frame 1 so that when the holder is lowered by unscrewing the screws 40, the lips 60 and 62 will engage. There should also be a sufficient gap between the lip 62 and the rear edge of the frame 1 to allow clearance of the flange 51 and the lip 60 when the motherboard holder 26 is disengaged from the temporary supporting element on the frame 1 and lowered to the floor.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A frame for an electronics assembly having a horizontal recess underneath the frame to which a generally planar motherboard module can be attached by raising the motherboard module up from below the frame and securing the motherboard module thereto in a horizontal plane by means of securing elements that extend along each edge of the recess, the frame including at least one temporary supporting element, arranged on side thereof, that can co-operate with the motherboard module to support the module along one edge thereof while the motherboard module is being secured to the frame by means of the securing elements.

2. A frame as claimed in claim 1, wherein the or each temporary supporting element comprises a hole for receiving a pin on the motherboard module.

3. A frame as claimed in claim 1, which includes one or more guidance elements for locating the motherboard module with respect for the frame in a horizontal plane.

4. An electronics assembly which comprises
   (i) a frame; and
   (ii) a generally planar, horizontal motherboard module that is removable by lowering the module from the bottom of the frame and which can be replaced by raising the module up to engage the bottom of the frame and securing it in position on the frame by means of one or more securing elements,
      wherein the frame and the motherboard module have co-operating temporary supporting elements that can be engaged to support one edge of the motherboard module until the or at least some of the securing elements have been engaged to secure the motherboard module to the frame or after the securing elements have been released.

5. An assembly as claimed in claim 1, wherein the temporary supporting elements together form a hinge that will support one edge portion of the motherboard module on the frame and will allow an opposite edge portion thereof to be lowered.

6. An assembly as claimed in claim 1, wherein the temporary supporting element on the frame and/or on the motherboard module is in the form of a flange.

7. An assembly as claimed in claim 1, wherein the temporary supporting element on one of the frame and the motherboard module is in the form of one or more pins that can engage one or more holes in the other of the frame and the module.

8. An assembly as claimed in claim 7, wherein the or each pin is located on the motherboard module and can engage a hole in the frame.

9. An assembly as claimed in claim 8, wherein the hole or each hole in the frame is elongate in the vertical direction.

10. An assembly as claimed in claim 1, wherein the motherboard module is lifted off the temporary supporting element on the frame when the, or at least some of the securing elements are engaged.

11. An assembly as claimed in claim 1, wherein the frame or the motherboard module has an EMI gasket that is compressed on engagement of the securing element or elements.

12. An assembly as claimed in claim 1, which includes guidance elements on the frame and/or the motherboard module for locating the motherboard module with respect to the frame in a horizontal plane.

* * * * *

UNITED STATES PATENT AND TRADEMARK OFFICE
CERTIFICATE OF CORRECTION

PATENT NO.    : 6,683,794 B2
DATED         : January 27, 2004
INVENTOR(S)   : Schnabel et al.

It is certified that error appears in the above-identified patent and that said Letters Patent is hereby corrected as shown below:

Column 6,
Lines 60 and 65, please replace "claim 1" with -- claim 4 --.

Column 7,
Lines 1 and 11, please replace "claim 1" with -- claim 4 --.

Column 8,
Lines 3 and 7, please replace "claim 1" with -- claim 4 --.

Signed and Sealed this

Seventeenth Day of August, 2004

JON W. DUDAS
*Acting Director of the United States Patent and Trademark Office*